United States Patent
Kutz et al.

(10) Patent No.: US 7,265,595 B1
(45) Date of Patent: Sep. 4, 2007

(54) STOCHASTIC RESET CIRCUIT

(75) Inventors: Harold Kutz, Snoqualmie, WA (US);
Timothy Williams, Bellevue, WA (US);
Morgan Whately, San Francisco, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/367,139

(22) Filed: Mar. 3, 2006

(51) Int. Cl.
H03L 7/00 (2006.01)

(52) U.S. Cl. .................................. 327/143; 327/198

(58) Field of Classification Search ............... None
See application file for complete search history.

(56) References Cited

U.S. PATENT DOCUMENTS

| | | | |
|---|---|---|---|
| 5,115,146 A | 5/1992 | McClure | |
| 5,187,389 A | 2/1993 | Hall et al. | |
| 5,394,104 A | 2/1995 | Lee | |
| 5,523,709 A | 6/1996 | Phillip et al. | |
| 5,528,182 A | 6/1996 | Yokosawa | |
| 5,778,238 A * | 7/1998 | Hofhine | 713/340 |
| 5,844,434 A | 12/1998 | Eschauzier | |
| 6,060,918 A | 5/2000 | Tsuchida et al. | |
| 6,204,701 B1 | 3/2001 | Tsay et al. | |
| 6,259,286 B1 * | 7/2001 | Papaliolios | 327/143 |
| 6,271,714 B1 | 8/2001 | Shin | |
| 6,362,669 B1 * | 3/2002 | Zhou et al. | 327/143 |
| 6,437,614 B1 | 8/2002 | Chen | |
| 6,621,311 B2 * | 9/2003 | Jeon | 327/142 |
| 6,677,787 B1 | 1/2004 | Kumar et al. | |
| 6,784,704 B2 * | 8/2004 | Sato | 327/143 |
| 6,854,067 B1 * | 2/2005 | Kutz et al. | 713/340 |
| 6,879,193 B2 * | 4/2005 | Okamoto et al. | 327/143 |
| 6,879,194 B1 | 4/2005 | Caldwell | |
| 2002/0027460 A1 | 3/2002 | Kobayashi et al. | |
| 2003/0011411 A1 | 1/2003 | Sterrantino et al. | |
| 2004/0012418 A1 | 1/2004 | Kim | |
| 2004/0066218 A1 | 4/2004 | Suzuki | |
| 2004/0189357 A1 | 9/2004 | Kang et al. | |
| 2005/0140406 A1 | 6/2005 | Rizzo et al. | |
| 2005/0189970 A1 * | 9/2005 | Nakatake et al. | 327/143 |
| 2005/0195000 A1 | 9/2005 | Parker et al. | |

* cited by examiner

*Primary Examiner*—Cassandra Cox
(74) *Attorney, Agent, or Firm*—Okamoto & Benedicto LLP

(57) ABSTRACT

In one embodiment, an integrated circuit device includes a power on reset (POR) circuit and a stochastic reset circuit configured to control enabling and disabling of the POR circuit. The stochastic reset circuit may have a value from among many possible values. The POR circuit may be enabled during a power up sequence of the device when the value of the stochastic reset during the power up is not a value designated to allow disabling of the POR circuit. The stochastic reset circuit may be configured such that the probability of the POR circuit being disabled during the power up is extremely low. After the power up sequence, the stochastic reset circuit may be controlled to allow disabling of the POR circuit to conserve power.

20 Claims, 5 Drawing Sheets

US 7,265,595 B1

STOCHASTIC RESET CIRCUIT

BACKGROUND OF THE INVENTION

1. Field of the Invention

The present invention relates generally to integrated circuits, and more particularly but not exclusively to power on reset circuits.

2. Description of the Background Art

A power on reset circuit (POR) prevents invalid conditions in an electrical circuit by ensuring that the electrical circuit has sufficient power before it is initialized or allowed to operate. In an integrated circuit device, for example, a POR circuit may be employed to ensure that sufficient power supply voltage is available to the device before the device is initialized or enabled. Otherwise, the POR circuit may keep the device disabled. A POR circuit thus allows the device to power up correctly after a shutdown, for example.

FIG. 1 schematically shows an example POR circuit. In the example of FIG. 1, the resistor ladder comprising resistors R1 and R2 scales the voltage of a power supply Vdd. A resistor R3 pulls up the input of an inverter 103 when a transistor Q1 is OFF, such as when Vdd is too low to generate sufficient voltage across the resistor R2. Upon power up, Vdd increases to a point where the voltage across resistor R2 is sufficient to turn ON the transistor Q1. At that point, referred to as "trip point," the transistor Q1 pulls the input to the buffer formed by inverters 103 and 104 to ground, deasserting the power on reset signal at the output of the inverter 104. In the example of FIG. 1, the power on reset signal is active high and asserted at low Vdd to initialize the device.

A POR circuit may also be used as a low voltage detector after the power ON event. For example, when Vdd subsequently falls below the trip point, the POR circuit of FIG. 1 may again assert the power on reset signal to re-initialize the device.

Achieving low power consumption in integrated circuit devices becomes more important as battery powered devices become more popular. For example, it is desirable to minimize power consumption when a device enters sleep mode, which is characterized by a relatively long period of time when the device is essentially inactive. Because a POR circuit is for the most part inactive except during power up, it is desirable to disable the POR circuit after the power up sequence. One problem with disabling a POR circuit is that it is difficult to ensure that the POR circuit is enabled during power up. If the device is not enabled during power up, device failure can result.

SUMMARY

In one embodiment, an integrated circuit device includes a power on reset (POR) circuit and a stochastic reset circuit configured to control enabling and disabling of the POR circuit. The stochastic reset circuit may have a value from among many possible values. The POR circuit may be enabled during a power up sequence of the device when the value of the stochastic reset during the power up is not a value designated to allow disabling of the POR circuit. The stochastic reset circuit may be configured such that the probability of the POR circuit being disabled during the power up is extremely low. After the power up sequence, the stochastic reset circuit may be controlled to allow disabling of the POR circuit to conserve power.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

The examples below may refer to logical states of a signal as being active HIGH or active LOW. It is to be understood, however, that such logical states are arbitrary and depend on implementation details. For example, a signal being active (i.e., asserted) in the logical LOW state in one application may be active in the logical HIGH state in another application.

A power on reset (POR) circuit may be designed to consume as little power as possible under operating conditions. This allows the POR circuit to be kept ON all the time without significantly straining device power. While desirable at first glance, this approach typically involves a penalty in terms of die area or performance. For example, the size of the circuit may be made relatively large to achieve low power consumption. The response time may also get slower because of the energy conserving design.

Another approach to achieving low power consumption in a POR circuit is to use a circuit that will tend to power up in a particular desired state (e.g., enabled). The circuit can then be put in an alternate state (e.g., disabled) at some point after power up. This approach is now described with reference to FIG. 2.

Figure 1:
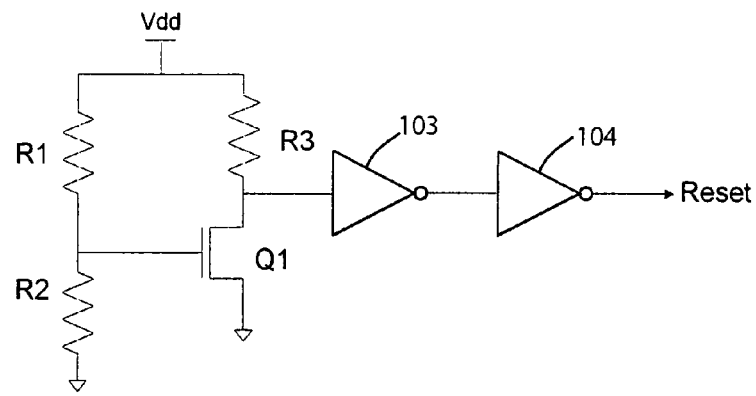
FIG. 1 schematically shows an example power on reset (POR) circuit.
Figure 2:
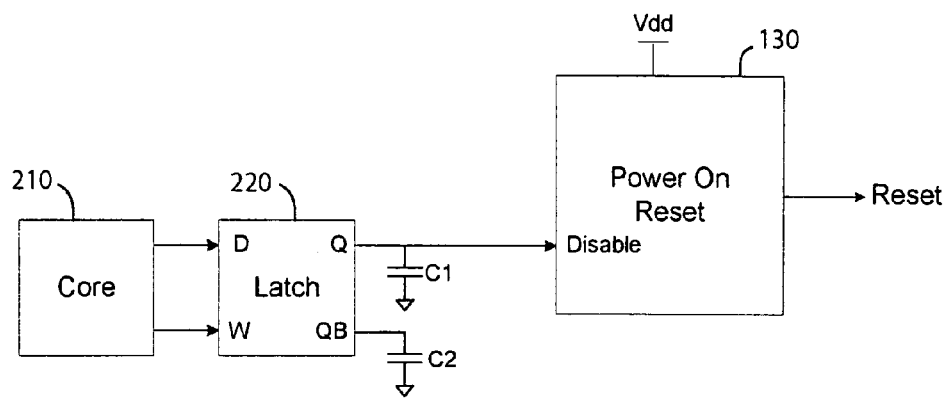
FIG. 2 schematically shows an example core circuit, imbalanced latch, and POR circuit.

FIG. 2 schematically shows an example core circuit 210, imbalanced latch 220, and POR circuit 130. The imbalanced latch 220 is so named because it tends to power up in one state over another by design. In the example of FIG. 2, the imbalanced latch 220 tends to power up with its Q output in the logical LOW state. A logical LOW at the disable input of the POR circuit 130 enables the POR circuit 130 to operate and thus assert its power on reset signal during power up. The imbalanced latch 220 includes a data input D and a write enable input W.

The core circuit 210 may comprise electrical circuitry configured to write to the imbalanced latch 220. At some point in time after power up, the core circuit 210 may write to the imbalanced latch 220 by presenting a logical HIGH signal at the write enable input W and a logical HIGH signal at the data input D. This results in the Q output of the imbalanced latch 220 going to the logical HIGH state, which disables the POR circuit 130 to conserve power. The imbalanced latch 220 may be made imbalanced by using unequal values of capacitors C1 and C2 at the differential outputs Q and QB or using imbalanced feature sizes in the normally symmetric latch cell, for example.

One problem with the imbalanced latch 220 and similar circuits is that they tend to have a failure rate under some conditions, such as at certain temperatures, voltages, power up rates (e.g., very fast or very slow), or power supply waveforms (e.g., bouncing power supply waveform). When a failure occurs, the imbalanced latch 220 will power up in a state where its Q output disables the POR circuit 130, preventing the POR circuit 130 from properly initializing the device.

Figure 3:
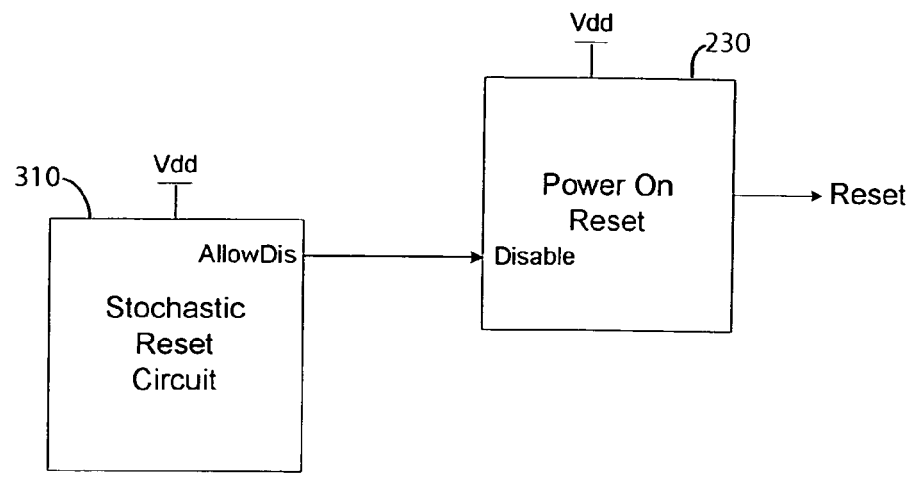
FIG. 3 schematically shows a stochastic reset circuit controlling a POR circuit, in accordance with an embodiment of the present invention.

FIG. 3 schematically shows a stochastic reset circuit 310 controlling a POR circuit 230, in accordance with an embodiment of the present invention. The stochastic reset circuit 310 and the POR circuit 230 may be incorporated in an integrated circuit device. In the example of FIG. 3, the POR circuit 230 has a disable input and outputs a power on reset signal. In one embodiment, the disable input is active HIGH in that a logical HIGH signal disables the POR circuit 230. A logical low signal at the disable input enables the POR circuit 230, allowing it to generate the power on reset signal to enable or initialize the device during power up.

In the example of FIG. 3, the stochastic reset circuit generates an AllowDis ("allow disable") signal that disables the POR circuit 230. The AllowDis signal is typically asserted at some point in time after the device has completed its power up sequence. The stochastic reset circuit 310 may comprise a probabilistic circuit configured to allow the stochastic reset circuit 310 to have a very high probability of powering up in the desired state, which in the example of FIG. 3 is a state that enables the POR circuit 230 during power up. In one embodiment, the stochastic reset circuit 310 is configured to have a very high probability of powering up in a state where the AllowDis signal is deasserted (logical LOW in the example of FIG. 3) to allow the POR circuit 230 to operate during power up. After the device is in a desired operating condition, which is typically some time after the power up sequence, the stochastic reset circuit 310 may be controlled to assert the AllowDis signal (logical HIGH in the example of FIG. 3) to disable the POR circuit 230, thereby minimizing power consumption. In the example of FIG. 3, a power supply Vdd provides power to both the stochastic reset circuit 310 and the POR circuit 230. In one embodiment, the POR circuit 230 is disabled by removing the power supply Vdd from the POR circuit 230.

Figure 4:
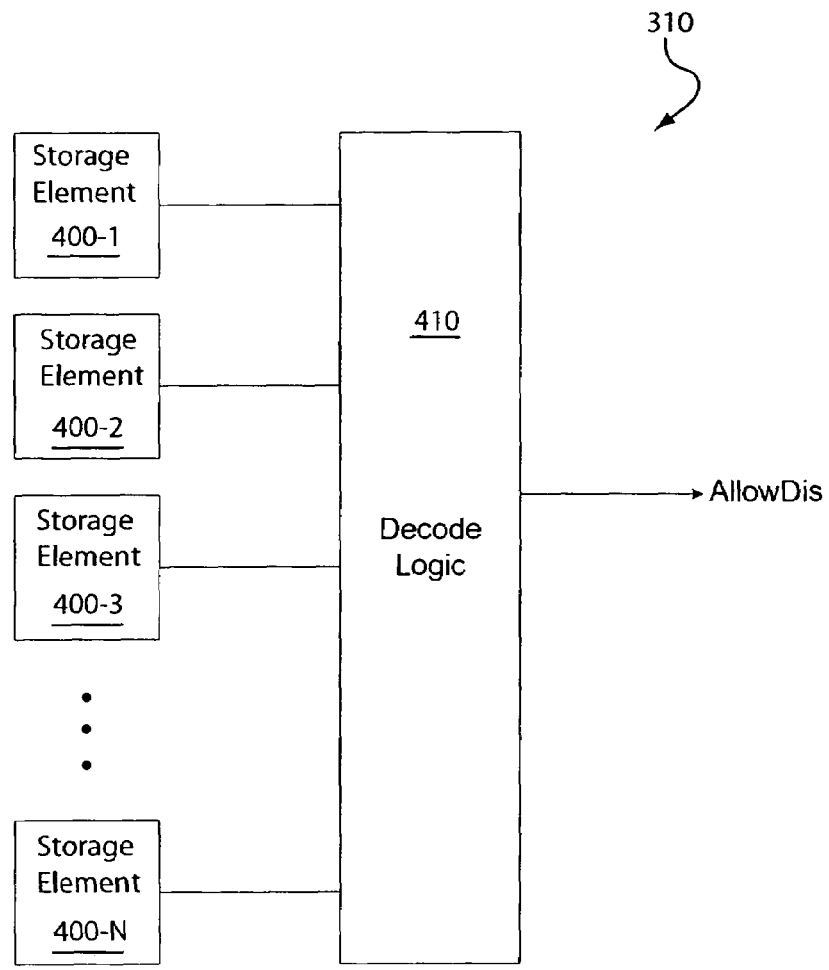
FIG. 4 schematically shows further details of a stochastic reset circuit in accordance with an embodiment of the present invention.

FIG. 4 schematically shows further details of the stochastic reset circuit 310 in accordance with an embodiment of the present invention. In the example of FIG. 4, the stochastic reset circuit 310 comprises a set of storage elements 400 (i.e., 400-1, 400-2, . . . 400-N) and a decode logic 410. Each storage element 400 may comprise an electrical circuit for storing information. A storage element 400 may comprise a register, a flip-flop, or latch, for example. Preferably but not necessarily, the storage elements 400 comprise identical circuits manufactured using the same process to make their behavior even more predictable. Together, the set of storage elements 400 outputs a binary word presented to the decode logic 410 for decoding. As can be appreciated, upon power up, the set of storage elements 400 will have a value among a plurality of possible values, the number of possible values depending on the number of storage elements 400 employed.

The decode logic 410 may comprise an electrical circuit for decoding the outputs of the storage elements 400. The decode logic 410 disables or allows disabling of the POR circuit 230 only for one particular value or limited number of values of the storage elements 400. In one embodiment, the decode logic 410 asserts the AllowDis signal only for a particular output value of the set of storage elements 400. That is, assuming there are N storage elements 400 and each storage element 400 stores and outputs 1-bit of information, the decode logic 410 may assert the AllowDis signal to disable or allow disabling of the POR circuit 230 in only 1 value out of a possible $2^N$ values of the storage elements 400. Any other values of storage elements 400 will result in the AllowDis signal being deasserted (thus allowing the POR circuit 230 to be enabled). For example, in an application where there are 16 storage elements 400 driving the decode logic 410, 1 value out of 65536 possible values may be used to assert the AllowDis signal. That particular value may be decoded by the decode logic 410 as an instruction to assert the AllowDis signal to disable the POR circuit 230. The remaining 65535 values may be decoded by the decode logic 410 as an instruction to not assert the AllowDis signal to allow the POR circuit 230 to operate.

In operation, the storage elements 400 will power up in an unknown state. However, since there is only one value out of many possible values of storage elements 400 outputs that will result in the POR circuit 230 being disabled, the chance of the storage elements 400 powering up in a state that will disable the POR circuit 230 is extremely low or, as explained below, essentially zero for practical purposes. Some time after the device is powered up and initialized, the storage elements 400 may be written with the one value that will result in the decode logic 410 disabling or allowing disabling of the POR circuit 230. Disabling of the POR circuit 230 helps the device conserve power.

Exploring the probability of the storage elements 400 powering up in the undesired state (i.e., state that disables the POR circuit 230) involves two considerations. First, if the power up state of the storage elements 400 is completely arbitrary, the probability of powering up in the desired state is a simple calculation. Assuming binary logic is employed in the design of the storage elements 400 and the decode logic 410, the probability of the single undesired state coming up out of all the possible states is 1 in $2^N$, where N is the number of storage elements 400.

A second consideration is that identical elements in an identical environment (e.g., process, temperature, voltage, power supply ramp profile, location inside the device) tend to power up in the same state. This can be exploited to improve the probability of power up in the desired state if the storage elements are kept as identical as practically possible. Assuming binary logic, if the storage elements power up to output either all logical HIGH or all logical LOW, then a decoding logic that requires approximately half of the storage elements to output a logical HIGH and half to output a logical LOW will have a very low probability of powering up in the undesired state. This can improve the probability of proper power up beyond the simple random-state calculation described above if all the elements power up randomly. For example, in the case with 16 storage elements, assume there is a 90% chance that all storage elements will power up in the identical state, and a select eight storage elements must output a logical HIGH and the remaining eight storage elements must output a logical LOW in order to enter the state that allows a POR circuit to be disabled. In that case, the probability of a successful power up increases from about 1 in 65536 to 1 in 100,000,000. Therefore, it can be seen that by choosing a large enough number of storage elements, the probability of powering up in the undesired state can be made essentially zero. That is, the probability of powering up in the undesired state can be made small enough so that the number of power up events required to achieve a reasonable probability of failure can be much greater than the practical number power ups a device will undergo in its lifetime.

Figure 5:
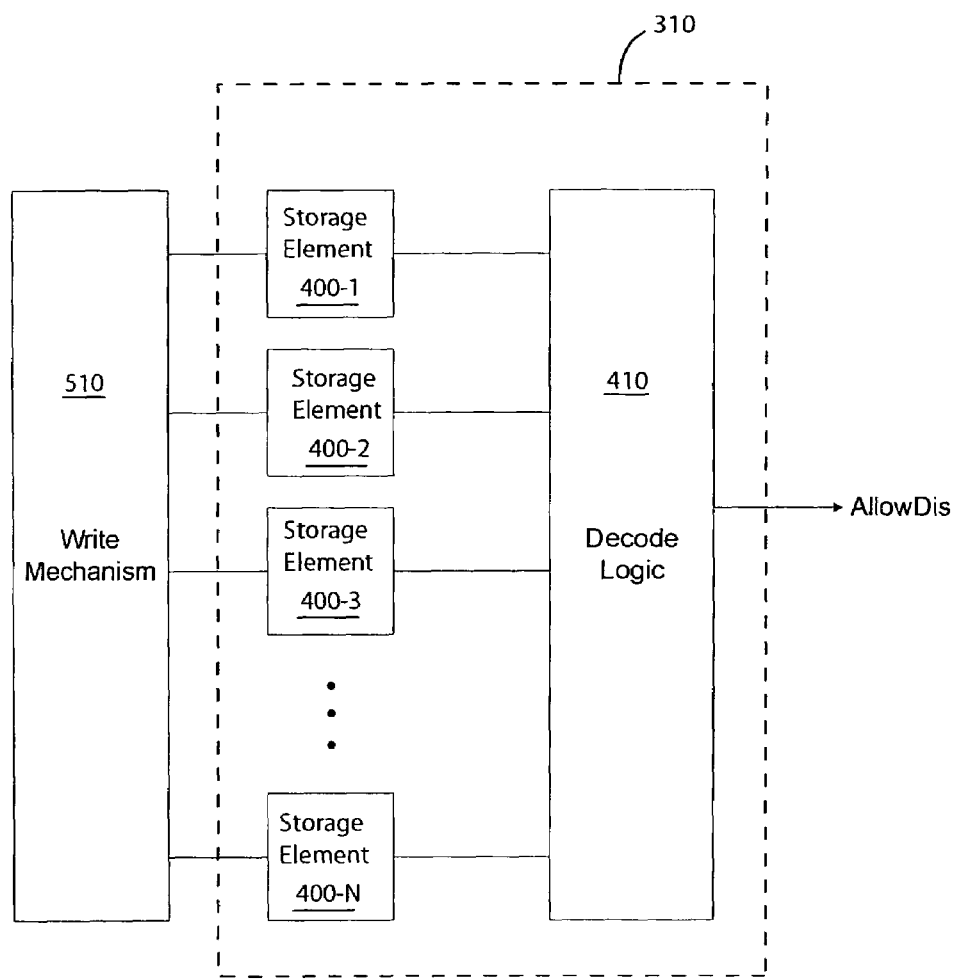
FIG. 5 schematically shows a stochastic reset circuit being driven by a write mechanism, in accordance with an embodiment of the present invention.

FIG. 5 schematically shows the stochastic reset circuit 310 being driven by a write mechanism 510, in accordance with an embodiment of the present invention. The write mechanism 510 may comprise electrical circuitry for writing a value into the storage elements 400. For example, the write mechanism 510 may comprise one or more registers of a microprocessor. Software may be used to write a disable code (i.e., unique value that will result in assertion of the AllowDis signal) into the register, which in turn outputs the disable code into the storage elements 400. Alternately, the storage elements 400 may form registers that are written to by the write mechanism 510. The storage elements 400 present the disable code to the decode logic 410, which decodes the disable code as an instruction to assert its AllowDis signal. Assertion of the AllowDis signal disables or allows disabling of the POR circuit 230.

As can be appreciated, the number of storage elements 400 may be increased to improve the probability of the stochastic reset circuit 310 enabling the POR circuit 230 during power up. The disable code to be entered into the storage elements 400 to disable the POR circuit 230 may also be chosen to maximize the chance of the storage elements 230 powering up with an output value that is different from the disable code. For example, the disable code may have a random value that has nearly equal number of logical HIGHs and logical LOWs.

Preferably, the control signal that disables the POR circuit is active HIGH so that the signal is at logical LOW during low power supply levels, such as during a power up, thereby enabling the POR circuit. For example, the AllowDis signal is preferably active HIGH. This way, the POR circuit 230 is enabled when the AllowDis signal is at logical LOW, a logical level that may be relatively easy to generate at low power levels.

Figure 6:
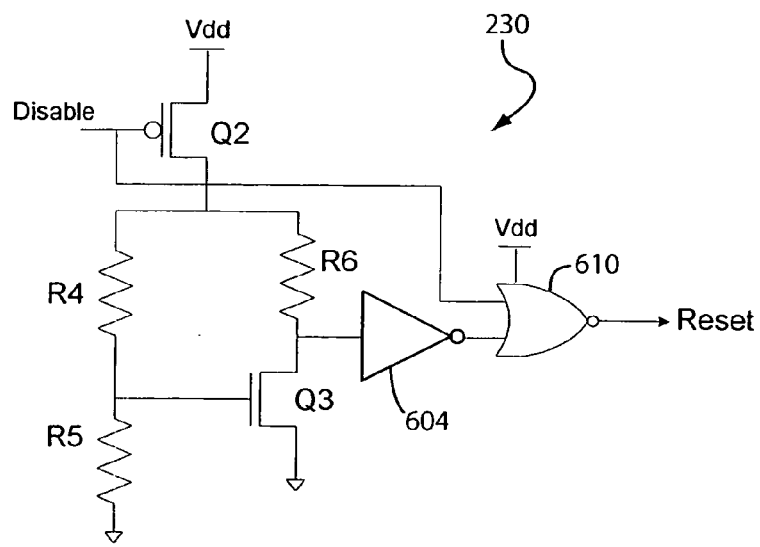
FIG. 6 schematically shows further details of a POR circuit in accordance with an embodiment of the present invention.

FIG. 6 shows further details of a POR circuit 230 in accordance with an embodiment of the present invention. The POR circuit 230 receives a Disable signal and outputs a power on reset signal. The Disable signal may be the AllowDis signal of the stochastic reset circuit 310 (see FIG. 3), for example. In the example of FIG. 6, a transistor Q2 controls the feeding of a power supply Vdd to the rest of the POR circuit 230 except the NOR gate 610, which is always connected to Vdd. The transistor Q2 turns OFF when the Disable signal is asserted (logical HIGH in FIG. 6), thereby powering down the POR circuit 230 to achieve low power consumption. Asserting the Disable signal also forces the power on reset signal at the output of the NOR gate 610 to be deasserted (logical LOW in FIG. 6).

The power supply Vdd is provided to the POR circuit 230 when the Disable signal is deasserted (logical LOW in FIG. 6). In that case, the resistor ladder comprising resistors R4 and R5 scales the voltage of the power supply Vdd. The resistor R6 pulls up the input to the inverter 604 when a transistor Q3 is OFF, such as when Vdd is too low to generate sufficient voltage across the resistor R5. This results in the output of the inverter 604 driving a logical LOW into an input of the NOR gate 610. With the Disable signal deasserted and the output of the inverter 604 at logical LOW, the power on reset signal is thus asserted at low Vdd.

Upon power up, Vdd increases to a point where the voltage across resistor R5 is sufficient to turn ON the transistor Q3. At that point, the transistor Q3 pulls the input of the inverter 604 to ground, resulting in a logical HIGH being presented at an input of the NOR gate 610. With the Disable signal deasserted and the output of the inverter 604 at logical HIGH, the power on reset signal at the output of the NOR gate 610 is deasserted. The power on reset signal may be used to reset the device that incorporates the POR circuit 230 to ensure proper initialization.

As can be appreciated, other factors may be taken into account before disabling the POR circuit 230. For example, besides requiring writing of a disable code in the stochastic reset circuit 310, other conditions may have to be met before the POR circuit 230 is powered down. For example, the AllowDis signal may be qualified by another signal.

Figure 7:
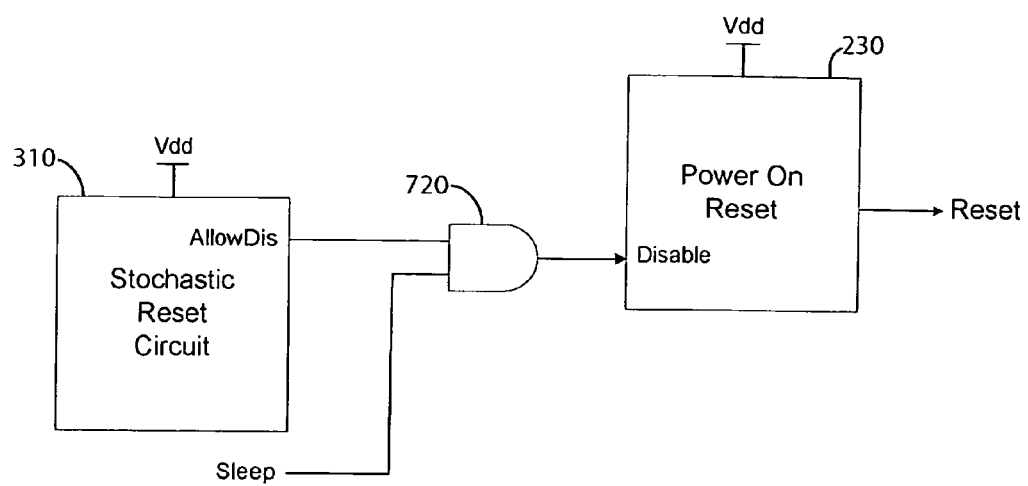
FIG. 7 schematically shows a control signal from a stochastic reset circuit being qualified by another signal, in accordance with an embodiment of the present invention.

In the example of FIG. 7, both the AllowDis signal and a Sleep signal must be asserted to disable the POR circuit 230. As previously described, the AllowDis signal may be asserted by writing the disable code into the storage elements of the stochastic reset circuit 310. The Sleep signal may come from other parts of the device to indicate that the device is going into sleep mode, which is a power conservation mode of the device. The Sleep signal and the AllowDis signal are ANDed by the AND gate 720, which outputs the Disable signal to the POR circuit 230 when both conditions (sleep mode and entry of disable code) for disabling the POR circuit 230 are satisfied. This way, the POR circuit 230 can only be disabled during sleep mode.

Figure 8:
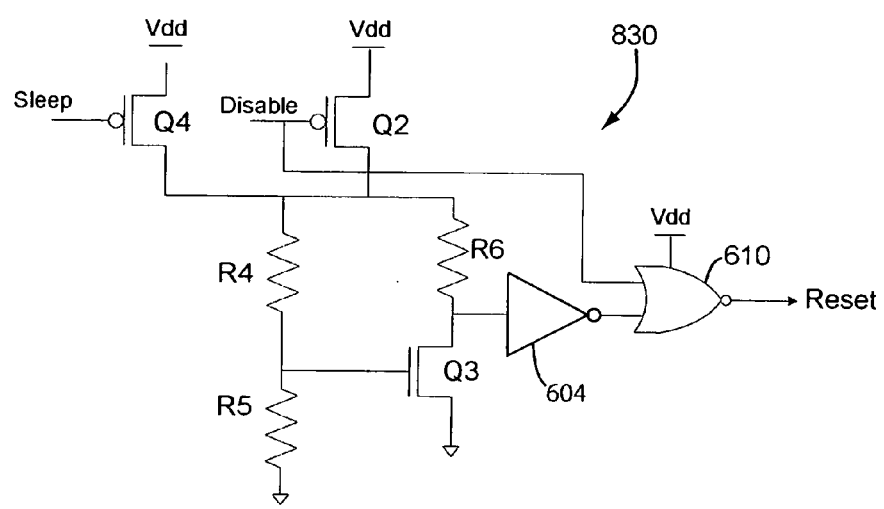
FIG. 8 schematically shows a POR circuit in accordance with an embodiment of the present invention.

FIG. 8 schematically shows a POR circuit 830 in accordance with an embodiment of the present invention. The POR circuit 830 is similar in design and operation to the POR circuit 230 of FIG. 6 except for the addition of a transistor Q4 to accept a Sleep signal. In the example of FIG. 8, a deasserted Sleep signal (logical LOW in FIG. 8) turns ON the transistor Q4 to allow the power supply Vdd to be provided to the POR circuit 830 even when the Disable signal is asserted. Thus, both the Sleep signal and the Disable signal need to be asserted (both logical HIGH in FIG. 8) to turn OFF the POR circuit 830. To prevent glitching the power on reset signal at the output of the NOR gate 610, the Disable signal may be asserted before asserting the Sleep signal to power down the POR circuit 830 for sleep mode. To reawaken from sleep mode during normal operation, the Sleep signal may be deasserted while keeping the Disable signal asserted. Other components of the POR circuit 830 have been previously described in connection with FIG. 6. The configurations shown in FIGS. 6 and 8 are exemplary, and additional devices may be introduced to drive nets to logical HIGH or LOW in the disabled state to achieve zero or low power consumption.

Improvements to power on reset circuits have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An integrated circuit device comprising:
 a power on reset (POR) circuit configured to generate a power on reset signal based on a control signal; and
 a stochastic reset circuit coupled to the POR circuit, the stochastic reset circuit having an initial value from among a plurality of possible values upon power up of the integrated circuit device, the stochastic reset circuit generating the control signal to enable the POR circuit during the power up when the initial value is not a designated value that allows disabling of the POR circuit, the designated value being one of the plurality of possible values.

2. The integrated circuit device of claim 1 wherein each value in the plurality of possible values comprises a binary word.

3. The integrated circuit device of claim 2 wherein the stochastic reset circuit comprises:
 a set of storage elements outputting the binary word; and
 a decode logic configured to decode the binary word.

4. The integrated circuit device of claim 3 wherein each storage element in the set of storage elements stores a single bit of information.

5. The integrated circuit device of claim 1 wherein the stochastic reset circuit comprises a plurality of storage elements and the probability of the initial value being the designated value is 1 in $2^N$ where N is the number of storage elements in the plurality of storage elements.

6. The integrated circuit device of claim 1 wherein the POR circuit includes a disable input that when activated removes power to the POR circuit and wherein the control signal is coupled to the disable input.

7. The integrated circuit device of claim 6 wherein application of the control signal to the disable input is qualified by another signal.

8. The integrated circuit device of claim 1 wherein the POR circuit includes a disable input that when activated allows disabling of the POR circuit and a sleep mode input that when activated together with the disable input removes power from the POR circuit.

9. The integrated circuit device of claim 1 wherein the stochastic reset signal allows disabling of the POR circuit when the stochastic circuit is controlled to have the designated value after the power up.

10. A method of controlling operation of a power on reset circuit in an integrated circuit device, the method comprising:
 determining an initial value of a set of storage elements upon power up of the integrated circuit device, the initial value being a value in a plurality of possible values of the set of storage elements; and
 enabling a power on reset (POR) circuit to generate a power on reset signal when the initial value is not a designated value that allows disabling of the POR circuit from generating the power on reset signal, the designated value being a value in the plurality of possible values of the set of storage elements.

11. The method of claim 10 wherein the set of storage elements comprises digital logic.

12. The method of claim 11 wherein the digital logic comprises flip-flops.

13. The method of claim 10 further comprising:
 receiving a first signal;
 generating a second signal based on a current value of the set of storage elements, the current value being a value in the plurality of possible values of the set of storage elements; and
 disabling the POR circuit from generating the power on reset signal when the first signal and the second signal are both asserted.

14. The method of claim 13 wherein the first signal comprises a sleep signal indicating that the integrated circuit device is going into a power conservation mode.

15. An integrated circuit device comprising:
 a stochastic reset circuit configured to have one of a plurality of possible values; and
 a power on reset (POR) circuit configured to generate a power on reset signal based on a current value of the stochastic reset circuit, the current value being one of the plurality of possible values of the stochastic reset circuit, the POR circuit being enabled to generate the power on reset signal during a power up of the integrated circuit device when the current value of the stochastic reset circuit during the power up of the integrated circuit device is not a particular value designated to allow disabling of the POR circuit.

16. The integrated circuit device of claim 15 wherein the current value of the stochastic reset circuit is stored in a set of storage elements.

17. The integrated circuit device of claim 16 wherein the probability of the set storage elements having a particular value in the plurality of possible values is 1 in $2^N$ where N is the number of storage elements in the set of storage elements.

18. The integrated circuit device of claim 15 wherein the current value can be changed by writing a new value to the set of storage elements.

19. The integrated circuit device of claim 15 wherein the current value is decoded by a decode logic generating a control signal used to control power provided to the POR circuit.

20. The integrated circuit device of claim 15 wherein power to the POR circuit is removed when the current value is equal to the particular value designated to allow disabling of the POR circuit.

* * * * *